(12) United States Patent
Kimura et al.

(10) Patent No.: US 7,030,480 B2
(45) Date of Patent: Apr. 18, 2006

(54) MULTILAYER BOARD AND A SEMICONDUCTOR DEVICE

(75) Inventors: Yoshiyuki Kimura, Kawasaki (JP); Atsushi Kikuchi, Kawasaki (JP); Yoshihiko Ikemoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/355,196

(22) Filed: Jan. 31, 2003

(65) Prior Publication Data

US 2004/0041277 A1  Mar. 4, 2004

(30) Foreign Application Priority Data

Aug. 29, 2002  (JP) .............................. 2002-250936

(51) Int. Cl.
  *H01L 23/04*  (2006.01)
  *H01L 23/12*  (2006.01)
  *H01L 23/14*  (2006.01)
  *H01L 23/48*  (2006.01)

(52) U.S. Cl. ...................... 257/698; 257/691; 257/701; 257/702; 257/774; 257/737

(58) Field of Classification Search ................ 257/691, 257/698, 778, 702, 692, 774, 737, 780, 690, 257/701; 361/794, 799; 174/255, 262
See application file for complete search history.

(56) References Cited

U.S. PATENT DOCUMENTS

| | | | | |
|---|---|---|---|---|
| 5,216,278 A | * | 6/1993 | Lin et al. ..................... | 257/688 |
| 6,426,468 B1 | * | 7/2002 | Utsunomiya et al. ....... | 174/261 |
| 6,861,740 B1 | * | 3/2005 | Hsu ............................ | 257/691 |

* cited by examiner

*Primary Examiner*—Nitin Parekh
(74) *Attorney, Agent, or Firm*—Westerman, Hattori, Daniels & Adrian, LLP

(57) ABSTRACT

Preparing a bottom grounding layer eliminates grounding pins, thereby the number of signal pins can be increased in a multilayer board that includes a grounding layer, a signal layer, a power supply layer, a grounding via, a signal via, a power supply via and the like in the insulation material of the multilayer board, the bottom grounding layer being electrically connected to the grounding layer.

8 Claims, 16 Drawing Sheets

MULTILAYER BOARD AND A SEMICONDUCTOR DEVICE

BACKGROUND OF THE INVENTION

1. Field of the Invention

The present invention generally relates to a multilayer board and a semiconductor device, and especially relates to a multilayer board and a semiconductor device wherein a grounding layer, a power supply layer, a signal layer, and a via that connects between the layers are prepared.

2. Description of the Related Art

FIGS. 1 through 5 show examples of the multilayer board and the semiconductor device of the conventional technology. FIG. 1 is an elevational view of an example of a semiconductor device 1 of the conventional technology, FIG. 2 is a sectional view expanding and showing a multilayer board 3 of the semiconductor device 1, and FIG. 3 is a bottom plan view of the multilayer board 3.

In the example shown in FIG. 1, the semiconductor device 1 is mounted on a system board 8. The semiconductor device 1 includes a semiconductor element 2 and the multilayer board 3. The semiconductor element 2 is mounted on the upper surface of the multilayer board 3 by flip-chip bonding, using a vamp 4.

Further, a land 6 is formed on the bottom surface of the multilayer board 3, and a connection pin 7 (solder ball), which serves as an external connection terminal, is installed at the land 6. The semiconductor element 2 is connected to the system board 8 through the multilayer board 3 by joining the connection pin 7 to a connection electrode 9.

As shown in FIG. 2, the multilayer board 3 includes a grounding layer 11, a signal layer 12, a power supply layer 13, and another grounding layer 14, which are sequentially formed in layers from the upper part of an insulation material 10. Each of the layers 11 through 14 is formed in the direction of the face of the multilayer board 3 (i.e., in the horizontal direction of FIG. 2).

Further, a grounding via 15, a signal via 16, and a power supply via 17 are formed in the insulation material 10. Each of the vias 15 through 17 is formed in the direction that is approximately perpendicular to the layers 11 through 14 (i.e., approximately in the vertical direction of FIG. 2.), such that predetermined connections of the layers 11 through 14 are carried out.

Specifically, the grounding via 15 connects the grounding layers 11 and 14 and a grounding land 6G. Further, a grounding pin 7G is provided to the grounding land 6G, and the grounding pin 7G is connected to a grounding electrode 9G of the system board 8. Similarly, the signal via 16 connects the signal layer 12 and a signal land 6S. Further, a signal pin 7S is provided to the signal land 6S, and the signal pin 7S is connected to a signal electrode 9S of the system board 8. Furthermore, the power supply via 17 connects the power supply layer 13 and a power supply land 6P. Further, a power supply pin 7P is provided to the power supply land 6P, and the power supply pin 7P is connected to a power supply electrode 9P of the system board 8.

In order to facilitate reading FIG. 2, a lattice pattern is given to grounding-related elements such as the grounding layers 11 and 14, the grounding via 15, the grounding land 6G, and the grounding pin 7G. Further, a dotted pattern is given to signal-related elements such as the signal layer 12, the signal via 16, the signal land 6S, and the signal pin 7S, and a slashed pattern (hatching) is given to power supply-related elements such as the power supply layer 13, the power supply via 17, the power supply land 6P, and the signal pin 7P. Further, the solder ball 7, when individually specified by different functions, is called the grounding pin 7G, the signal pin 7S, and the power supply pin 7P, as described above.

With reference to FIG. 3, the bottom of the multilayer board 3 (the bottom surface 18) is described. As shown in FIG. 3, in the conventional multilayer board 3, all of the three kinds of the pins, namely, the grounding pin 7G, the signal pin 7S, and the power supply pin 7P, are provided in the shape of a lattice on the bottom surface 18.

FIG. 4 shows a signal wiring line that connects the semiconductor element 2 and the signal pin 7S. Further, FIG. 5 shows a sectional view of FIG. 4 intersected by a plane represented by the line A—A.

The vamp 4 provided to the semiconductor element 2 is connected to a pad 19 formed on the upper surface of the multilayer board 3. The pad 19 is connected to the signal land 6S through the signal via 16A, the signal layer 12, and the signal via 16B. Here, a clearance 14A is formed in the grounding layer 14 so that the signal via 16B and the grounding layer 14 are not short-circuited. The signal via 16B passes through the clearance 14A, and is connected to the signal land 6S.

Around the signal via 16B, two or more grounding vias 15 are provided, as shown in FIG. 5. The grounding vias 15 are structured such that they are connected to the grounding layer 11 and the grounding layer 14. By structuring the multilayer board 3 in this manner, impedance of the signal via 16B is controlled, and degradation of signal characteristics is prevented. Details of the structure are indicated by the Provisional Publication H6-85099.

Conventionally, not much attention has been paid to the magnitude (diameter W2: indicated by an arrow W2 shown in FIG. 4) of the clearance 14, and the clearance has been simply set up at arbitrary dimensions so as to allow the signal via 16B to pass through. For this reason, the diameter W2 of the clearance 14A has been set up smaller than the diameter of the signal land 6S (indicated by an arrow W1 in FIG. 4), that is, W2<W1.

In recent years, the number of pins to be provided to the multilayer board 3 has been rapidly increasing. For example, in a 1000-pin multilayer board 3, 500 signal pins 7S, 250 power supply pins 7P, and 250 grounding pins 7G are provided. Further, demands are growing for a larger number of signal pins 7S without changing the size of the present multilayer board 3.

If a demand is that the number of the signal pins 7S of the 1000-pin multilayer board 3 is to be increased to 700 from 500, the numbers of the grounding pins 7G and the power supply pins 7P will have to be decreased to 150 pins, respectively. Consequently, capacity of the power supply and grounding becomes inadequate, causing problems such as voltage drops and simultaneous switching noise.

In order to solve the problems as above, a method is conceived whereby the numbers of the power supply layers and the grounding layers are increased, such that the power supply and grounding capacities are improved. However, this method results in an increase in manufacturing costs, an increase in the thickness of the multilayer board 3 and the like, due to the increased number of layers.

Further, at the external connection terminal portion of the bottom surface of the multilayer board 3, a large coupling factor, therefore, a large capacitance is present between the land 6 or the connection pin 7, and the wide layer (e.g., the grounding layer 14 in FIG. 4). For this reason, the impedance of this portion will become lower than the impedance of the signal via 16. Consequently, signal reflection arises at the bottom surface portion of the multilayer board 3, and degradation of the signal characteristics occurs. Therefore, impedance matching in this portion is required.

It is effective to provide a plurality of grounding vias 15A through 15C along the circumference of the signal via 16B (refer to FIG. 4 and FIG. 5), as indicated by the above mentioned Provisional Publication H6-85099, thereby the impedance of the signal via 16B is controlled. However, conventionally, the grounding vias 15A through 15C are simply provided around the perimeter of the signal via 16B, without paying attention as to an efficient manner of the arrangement.

SUMMARY OF THE INVENTION

In view of above, it is a general object of the present invention to provide a multilayer board and a semiconductor device that are capable of providing a larger number of signal pins than conventionally, without increasing dimensions of the multilayer board and the semiconductor device, which substantially obviate one or more of the problems caused by the limitations and disadvantages of the related art.

Another object of the present invention is to provide appropriate impedance matching of a signal via of the multilayer board.

Features and advantages of the present invention will be set forth in the description that follows, and in part will become apparent from the description and the accompanying drawings, or may be learned by practice of the invention according to the teachings provided in the description. Objects as well as other features and advantages of the present invention will be realized and attained by the multilayer board and the semiconductor device particularly pointed out in the specification in such full, clear, concise, and exact terms as to enable a person having ordinary skill in the art to practice the invention.

To achieve these and other advantages and in accordance with the purpose of the present invention, as embodied and broadly described herein, the present invention provides a bottom grounding layer on the bottom surface of insulation material comprising the multilayer board, which dispenses with grounding pins conventionally provided at the bottom surface, enabling an increase in the number of signal pins without enlarging the dimensions of the multilayer board.

Instead of the bottom grounding layer, a bottom power supply layer may be provided on the bottom surface of the insulation material, which dispenses with power supply pins, also enabling an increase in the number of signal pins without enlarging the dimensions of the multilayer board.

Both a bottom ground layer and a bottom power supply layer may be provided, sharing the space of the bottom surface.

The bottom grounding layer and the bottom power supply layer enhance electrical properties of grounding and power supply, respectively, because the electrically contacting area of the layers is greater than that of the conventional technology, such as a solder ball.

Preparing the bottom grounding layer and the bottom power supply layer enables a decrease in the number of layers in the insulation material, helping to make the multilayer board thinner.

The bottom grounding layer and the bottom power supply layer can be covered by a conductive film that serves as a connection terminal for an external point, improving the electrical connection properties.

In achieving the objectives, the present invention further provides a clearance around the signal land, the diameter of the clearance being greater than the diameter of the signal land, such that impedance of the signal via can be controlled.

The present invention also provides a semiconductor device that employs the multilayer board of the present invention, which performs highly reliably, offering satisfactory signal characteristics.

DESCRIPTION OF THE PREFERRED EMBODIMENTS

In the following, embodiments of the present invention will be described with reference to the accompanying drawings.

Figure 6:
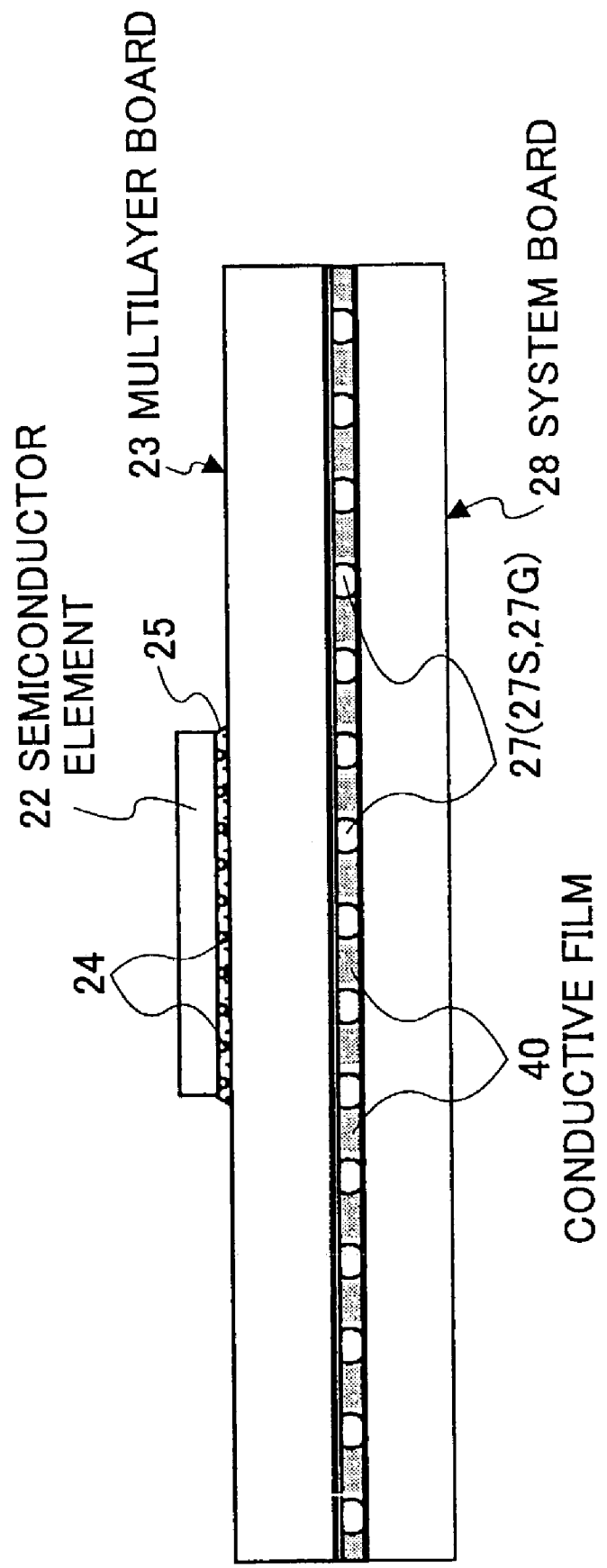
FIG. 6 is an elevational view of the semiconductor device of the first embodiment of the present invention.
Figure 7:
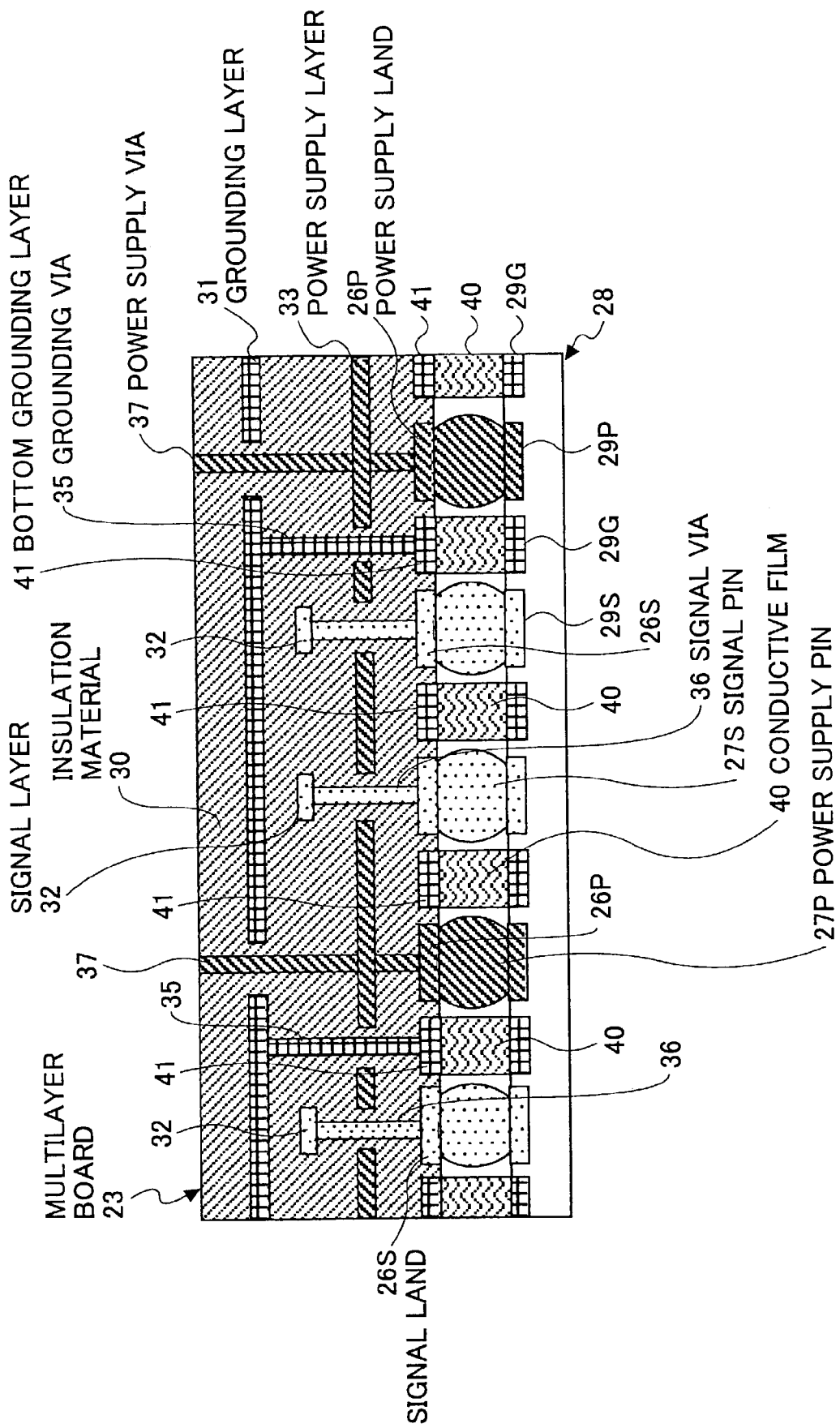
FIG. 7 is a sectional view of the semiconductor device of the first embodiment of the present invention.
Figure 8:
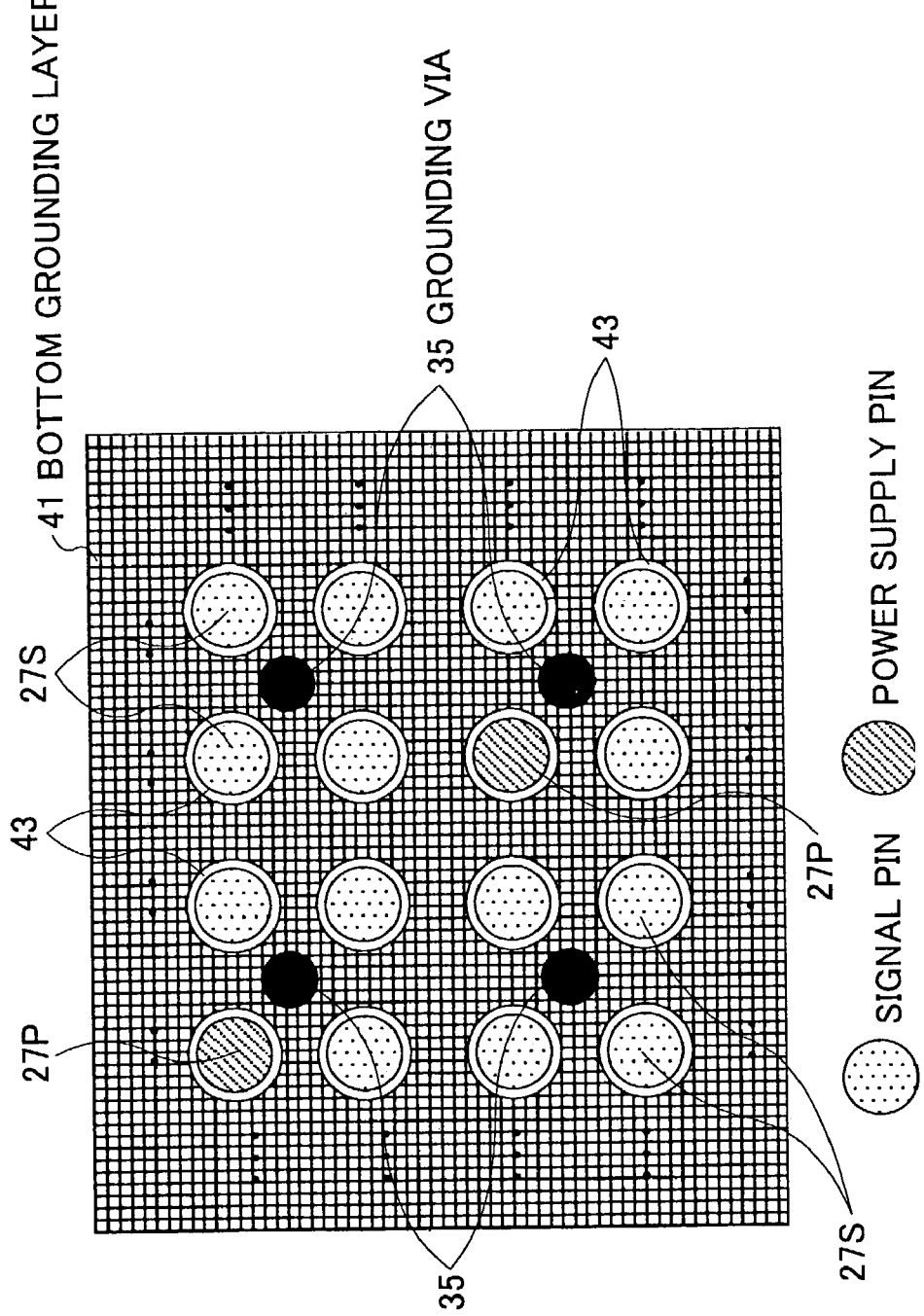
FIG. 8 is a bottom plan view of the semiconductor device the first embodiment of the present invention.

FIGS. 6 through 8 show a semiconductor device 20 and a multilayer board 23 of the first embodiment of the present invention. FIG. 6 is an elevational view of the semiconductor device 20 of the first embodiment of the present invention. FIG. 7 is a sectional view expanding and showing the multilayer board 23 of the semiconductor device 20, and FIG. 8 is a bottom plan view of the multilayer board 23.

The semiconductor device 20 of the present embodiment is mounted on a system board 28, for example, as shown in FIG. 6. The semiconductor device 20 includes a semiconductor element 22 and the multilayer board 23.

Two or more vamps 24 are formed on the circuit formation side (undersurface in the figure) of the semiconductor element 22. The semiconductor element 22 is mounted on the multilayer board 23 by flip chip bonding the vamp 24 to a pad 46 (refer to FIG. 11) that is formed on the upper surface of the multilayer board 23. Further, after the semiconductor element 22 is flip chip bonded to the multilayer board 23, under-filling resin 25 is inserted between the semiconductor element 22 and the multilayer board 23, such that the mechanical strength of the bonding is improved.

Further, on the undersurface of the multilayer board 23, two or more connection pins 27 (consisting of a solder vamp) are provided. The semiconductor device 20 is mounted on the system board 28 by bonding the connection pins 27 to the system board 28.

Next, the internal structure of the multilayer board 23 is explained with reference to FIG. 7, which is a sectional view expanding and showing a part of the multilayer board 23. As shown in FIG. 7, the multilayer board 23 includes a grounding layer 31, a signal layer 32, a power supply layer 33, and a bottom grounding layer 41 at the bottom, the bottom grounding layer 41 being the feature of the present embodiment. All the layers are formed in an insulation material 30 made of an insulation resin. The layers 31 through 33 and 41 are made of a conductive material, such as copper, and are formed in a predetermined pattern in the direction of the surface of the multilayer board 23 (in the horizontal direction of FIG. 7).

Further, on the bottom surface of the insulation material 30 (the bottom surface of multilayer board 23), a power supply land 26P and a signal land 26S are formed with the bottom grounding layer 41. The lands 26P and 26S are made of conductive material, such as copper, like the layers 31 through 33, and 41.

A power supply pin 27P is connected to the power supply land 26P, and, therefore, the power supply land 26P is connected to an external point of the system board 28 through the power supply pin 27P. Similarly, the signal pin 27S is connected to the signal land 26S, and, therefore, the signal land 26S is connected to an external point of the system board 28 through the signal pin 27S.

Furthermore, a grounding via 35, a signal via 36, and a power supply via 37 are formed in the insulation material 30. Each of the vias 35 through 37 is formed by inserting copper to a hole formed through the layers at a predetermined position. Each of the vias 35 through 37 is formed in the direction that is approximately orthogonal to the layers 31 through 33 and 41 (in the vertical direction in FIG. 7). In this manner, the layers 31 through 33 and 41 are inter-connected by the vias 35 through 37 in a predetermined manner.

Specifically, the signal via 36 connects the signal layer 32 and the signal land 26S. Further, the signal pin 27S is provided with the signal land 26S, and the signal pin 27S is connected to a signal electrode 29S of the system board 28. Further, the power supply via 37 connects the power supply layer 33 and the power supply land 26P. Further, the power supply pin 27P is provided with the power supply land 26P, and the power supply pin 27P is connected to a connection electrode 29P of the system board 28.

Furthermore, the grounding via 35 connects the grounding layer 31 and the bottom grounding layer 41. Further, the bottom grounding layer 41 is provided with a conductive film 40 that is connected to a grounding electrode 29G of the system board 28 (for convenience of explanation, details about the conductive film 40 and the bottom grounding layer 41 will be given later).

In order to facilitate reading of FIG. 7, a lattice pattern is given to grounding-related elements, a dotted pattern is given to signal-related elements, and a slash pattern (hatching) is given to power supply-related elements.

The connection pin 27, when individually specified for various functions, is called the grounding pin 27G, the signal pin 27S, and the power supply pin 27P.

Next, the bottom surface of the multilayer board 23 is explained, referring to FIG. 8. As shown in FIG. 8, the bottom grounding layer 41 is formed on the bottom surface of the multilayer board 23 of the present embodiment. The bottom grounding layer 41 occupies the entire bottom surface of the multilayer board 23 except for the positions where the power supply land 26P (for the power supply pin 27P) and the signal land 26S (for the signal pin 27S) are provided. A clearance 43 is formed between the power supply land 26P and the bottom grounding layer 41; and between the signal land 26S and the bottom grounding layer 41, such that a short circuit to the bottom grounding layer 41 of the lands 26P and 26S is prevented.

In this manner, the present embodiment forms the bottom grounding layer 41 on the bottom surface of the insulation material 30, such that a grounding connection to the system board 28 can be made at an arbitrary position of the bottom grounding layer 41, except for the positions where the lands 26P and 26S are located.

Further, in the present embodiment, for electrically connecting the bottom grounding layer 41 and the connection electrode 29G of the system board 28, a conductive film 40 is used. The conductive film 40 is made of glass fiber that is formed as a film-like base, in which electrically conductive silver filler is impregnated. In this manner, the bottom grounding layer 41 and the system board 28 are electrically connected through the conductive film 40.

The conductive film 40 can easily be fixed to an arbitrary position of the bottom grounding layer 41, using, for example, a conductive adhesive. Accordingly, in the present embodiment, the conductive film 40 is provided at positions adjacent to the power supply pins 27P and the signal pins 27S, as shown in FIG. 7.

Further, the bottom grounding layer 41 and the grounding layer 31 are connected by the grounding via 35. Since the bottom grounding layer 41 is formed covering almost all the bottom layer of the multilayer board 23, the grounding via 35 can be connected to an arbitrary position of the bottom grounding layer 41, except for the positions where the power supply pins 27P and the signal pins 27S are located.

In this manner, installation positions of the grounding via 35 can be determined with high flexibility, facilitating the placement of the vias 35, 36, and 37, and the layers 31 and 32 in the insulation material 30. Consequently, the vias 35, 36, and 37 and the layers 31 and 32 can be provided at a high density, making it possible to form the multilayer board 23 with small dimensions in a thin shape, or to increase the number of pins.

Figure 1:
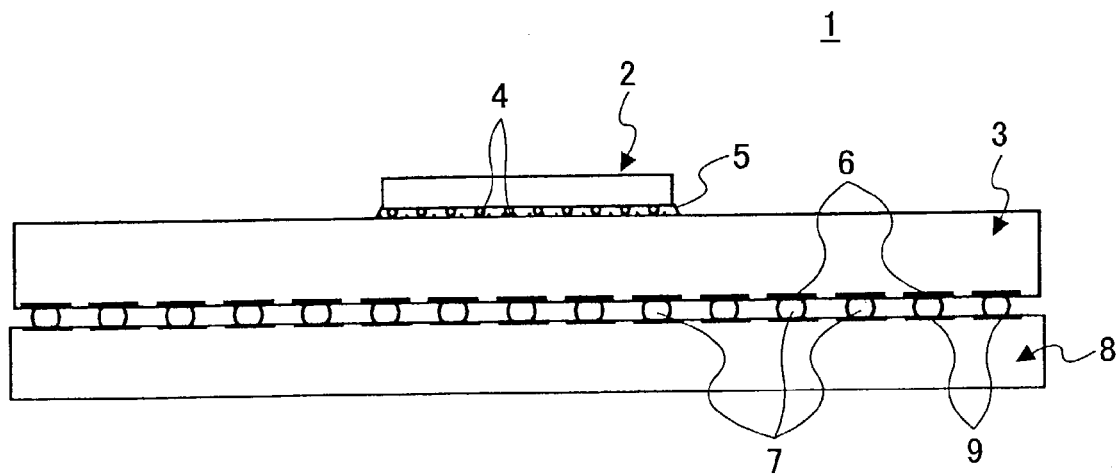
FIG. 1 is an elevational view showing an example of a conventional semiconductor device.
Figure 2:
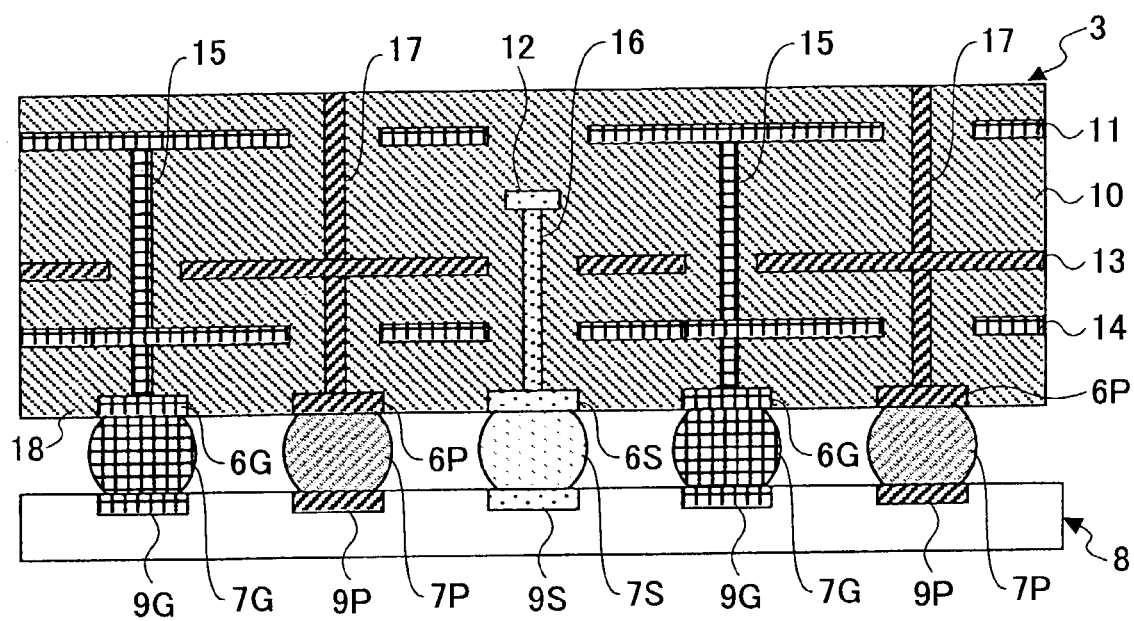
FIG. 2 is a sectional view of the conventional semiconductor device.
Figure 3:
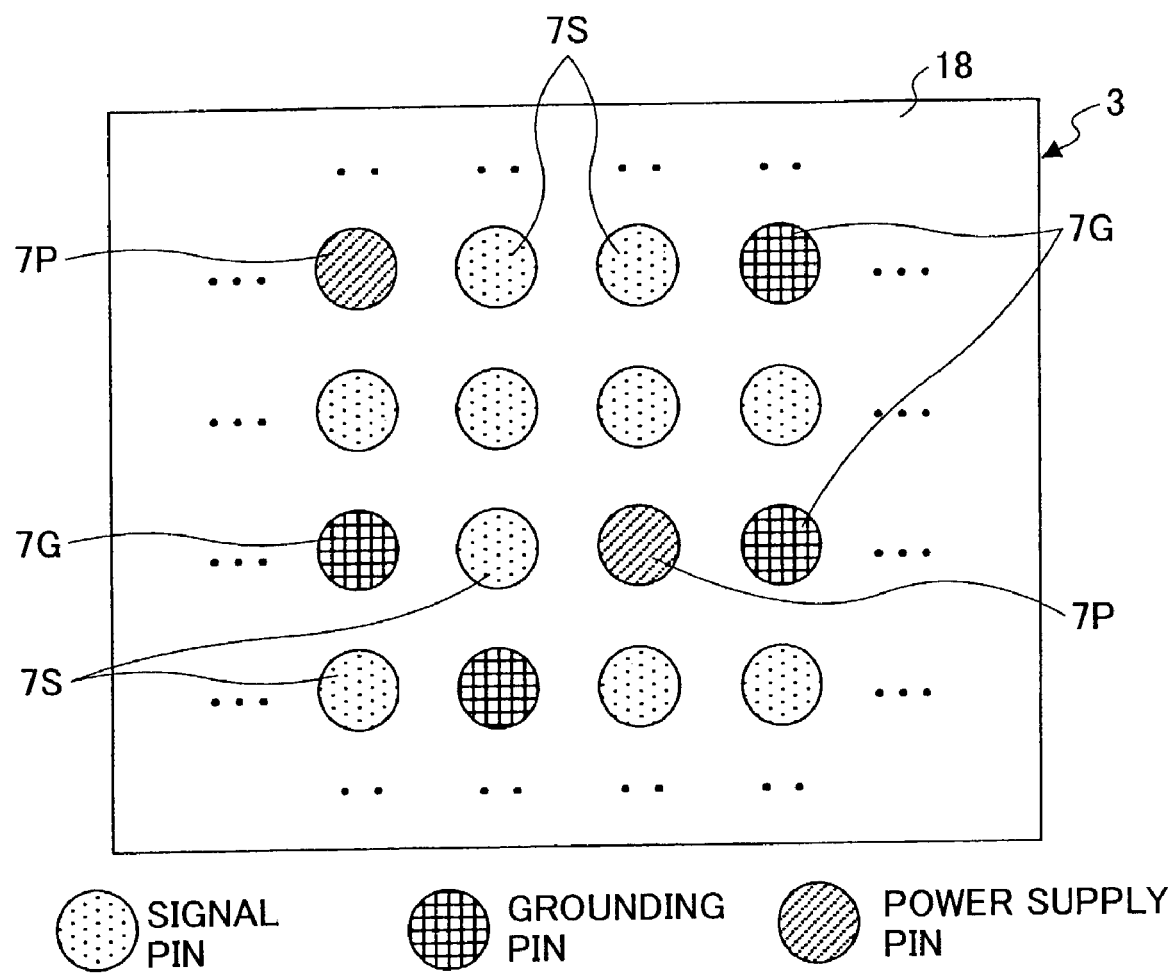
FIG. 3 is a bottom plan view of the conventional semiconductor device.
Figure 4:
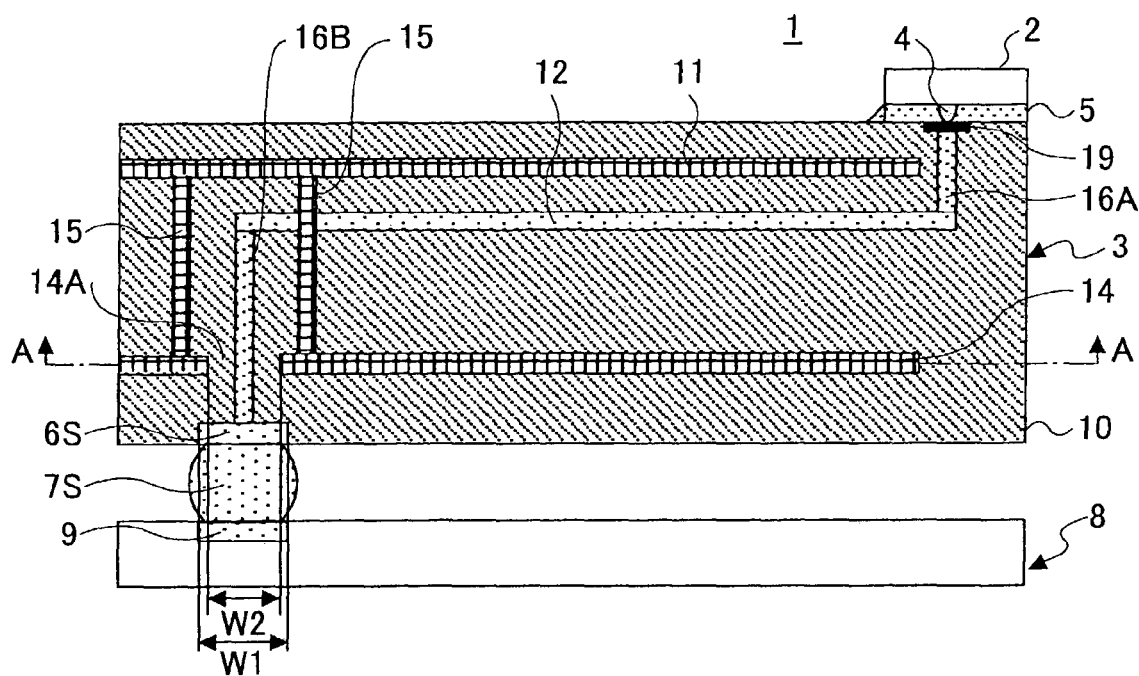
FIG. 4 shows a structure near a signal via of the conventional semiconductor device.
Figure 5:
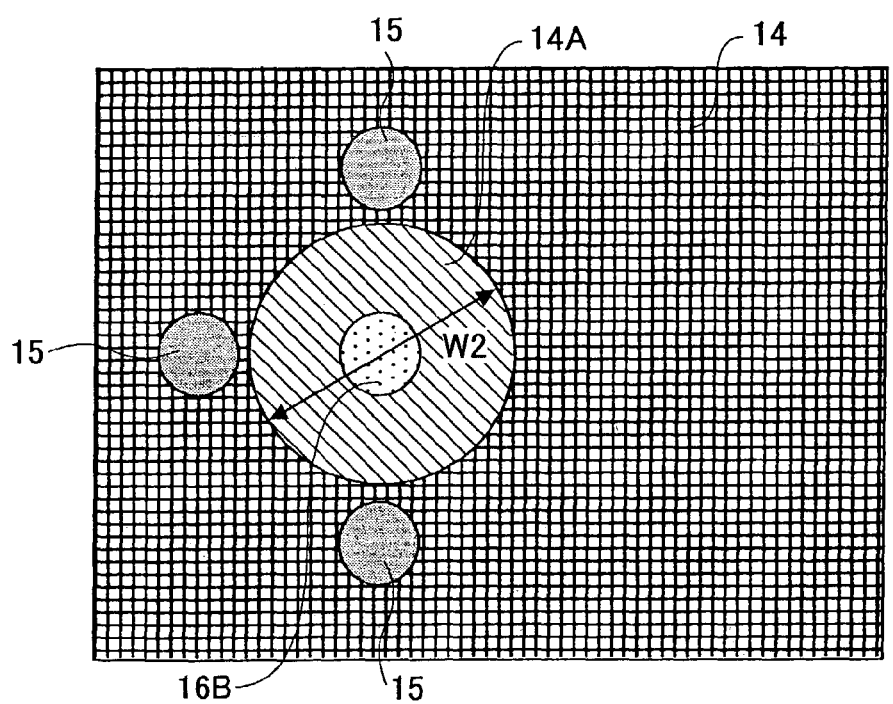
FIG. 5 is a sectional view of FIG. 4 intersected by a plane represented by the line A—A.

Further, in the present embodiment, since grounding pins are not installed at the bottom surface, the space previously occupied by the grounding pins can now be used for additional signal pins 27S. Specifically, according to the present embodiment as shown in FIG. 8, four more signal pins 27S are provided, as compared with the conventional configuration as shown in FIG. 3. Thus, the number of the signal pins 27S can be increased without changing the size of the multilayer board 23 by forming the bottom grounding layer 41 at the bottom surface of the insulation material 30.

In addition, since the grounding connection of the bottom grounding layer 41 with the system board 28 can be provided at an arbitrary position, a larger contact area for the grounding connection can be attained, as compared with the conventional method, such as a solder ball. In other words, a desired quantity of the conductive films 40 that connect the bottom grounding layer 41 and the system board 28 can be installed at any position except for the positions where the signal land 26S (for the signal pin 27S) and the power supply land 26P (for the power supply pin 27P) are located.

Accordingly, since a large electric connection area can be provided for the system board 28 at arbitrary positions of the bottom grounding layer 41, electric connection properties are improved. Further, since the conductive film 40 can be easily provided in arbitrary positions of the bottom grounding layer 41, the positions of the lands 26S and 26P are not constrained by employing the conductive film 40.

Furthermore, by forming the bottom grounding layer 41 at the bottom of the insulation material 30, the number of grounding layers in the insulation material 30 is reduced by one, contributing to making the multilayer board 23 thinner.

In this manner, the semiconductor device 20 employing the multilayer board 23 according to the first embodiment of the present invention can be made smaller and thinner, providing a larger number of signal pins, and high stability.

Next, the second embodiment of the present invention is explained.

Figure 9:
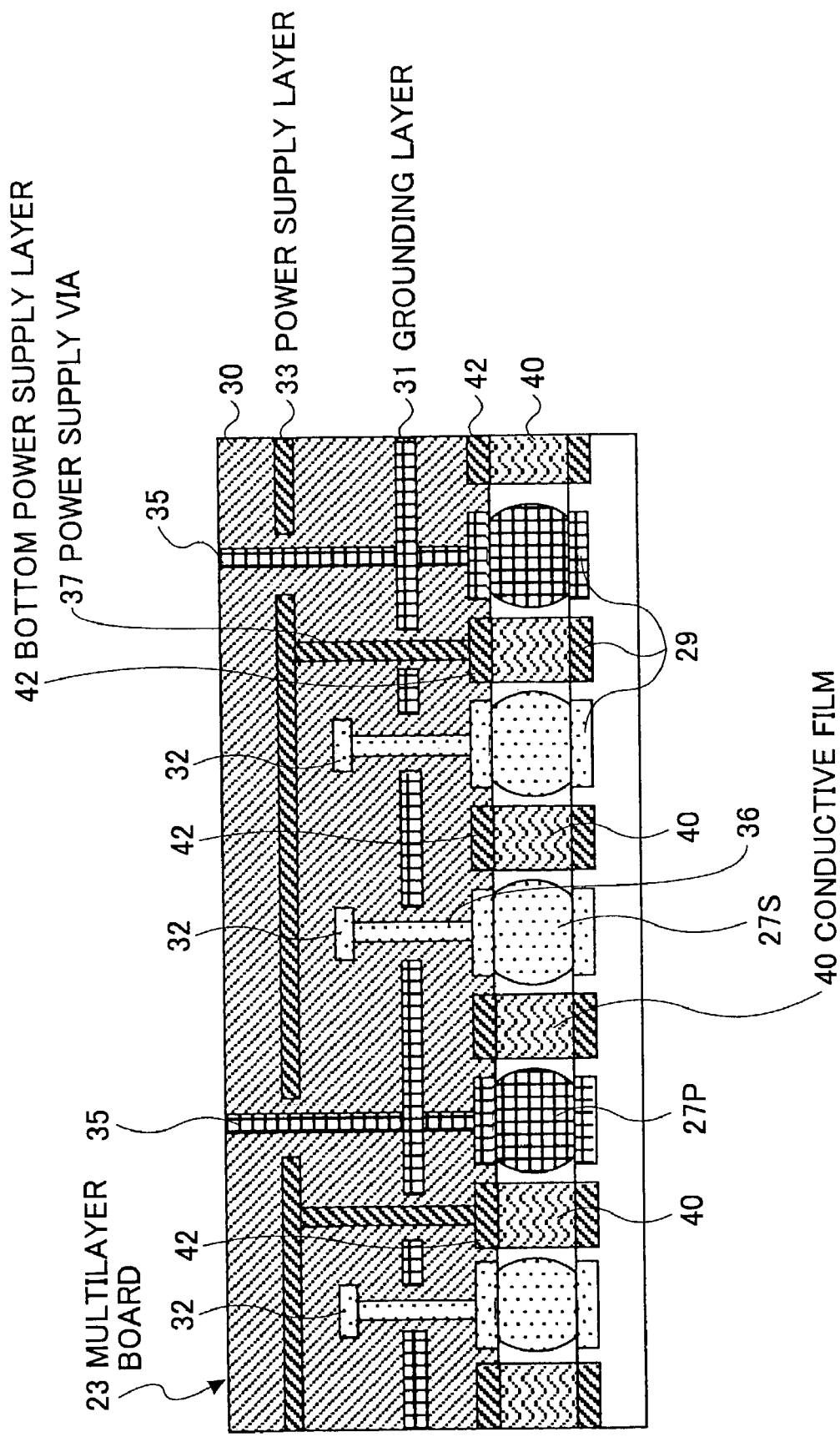
FIG. 9 is a sectional view of the semiconductor device the second embodiment of the present invention.
Figure 10:
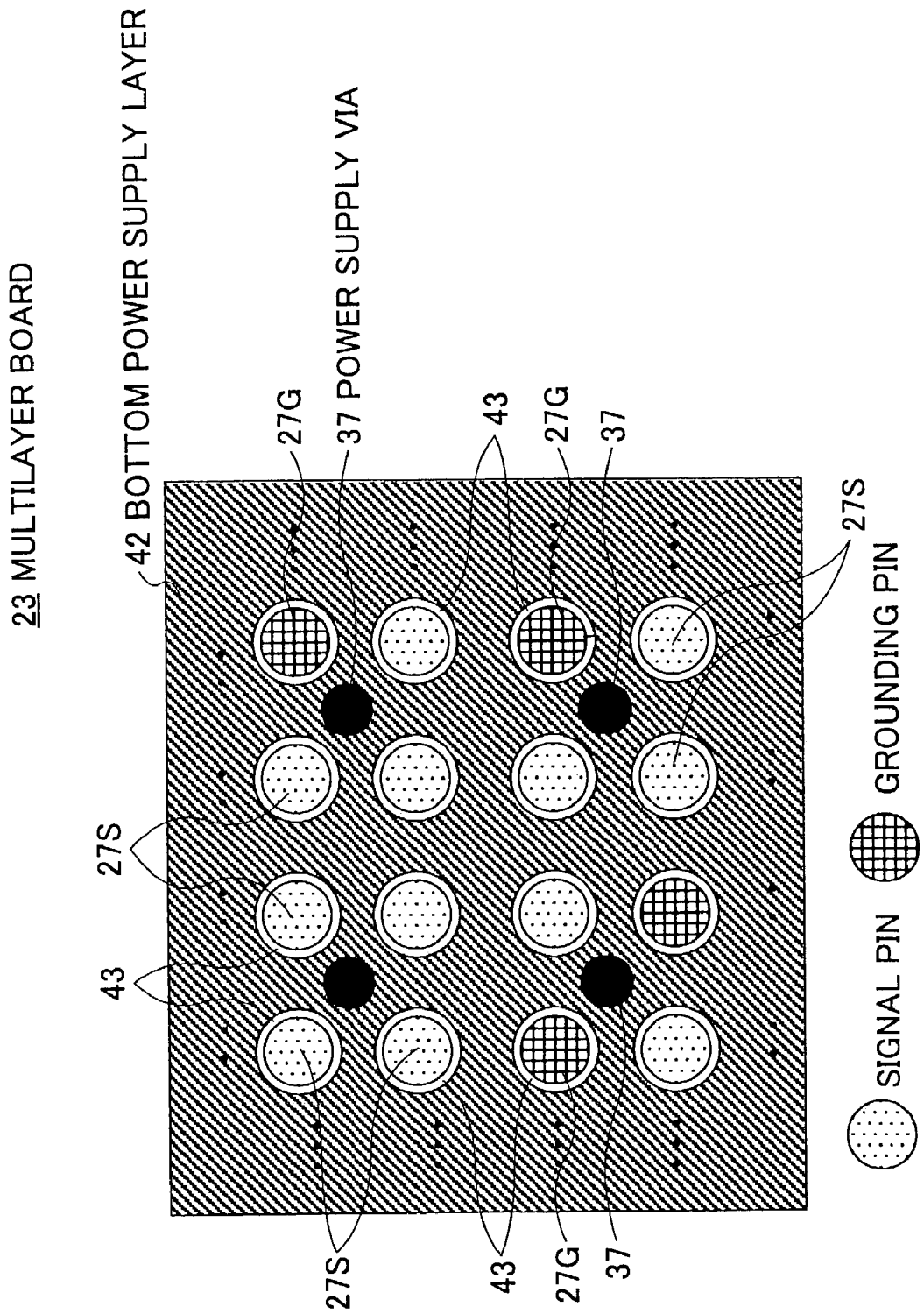
FIG. 10 is a bottom plan view of the semiconductor device of the second embodiment of the present invention.

FIG. 9 and FIG. 10 show the multilayer board 23 of the second embodiment of the present invention. In FIG. 9 and FIG. 10, and FIGS. 11 through 18 that will be referenced to in later embodiments, the same reference numbers are given to the same elements as shown in FIGS. 6 through 8 that are used for explanation of the first embodiment, and the explanation of the same elements will not be repeated.

In the first embodiment, the bottom grounding layer 41 is formed at the bottom surface of the insulation material 30 of the multilayer board 23, thereby the number of signal pins 27S is increased by eliminating the grounding pins. In contrast, a bottom power supply layer 42 is formed at the bottom surface of the insulation material 30 of the multilayer board 23 in the second embodiment, thereby the number of signal pins 27S is increased by eliminating the power supply pins.

In other words, the configuration of the second embodiment is the same as the first embodiment, except that the grounding-related elements and the power supply-related elements are interchanged. The effect of the second embodiment is also similar to that of the first embodiment.

Specifically, by forming the bottom power supply layer 42 at the bottom surface of the insulation material 30, the bottom surface functions as the power supply land, making it possible to connect the bottom power supply layer 42 to the system board 28 at arbitrary positions. Further, the present embodiment also employs the conductive film 40 in order to electrically connect the bottom power supply layer 42 and the system board 28, so that a larger connection area between the bottom power supply layer 42 and the system board 28 is attained, as compared with the conventional method, such as a solder ball. Therefore, the electric connection properties of the bottom power supply layer 42 and the system board 28 are improved.

Further, since the flexibility of the installation positions of the power supply vias 37 is raised, and the arrangement of the vias 35, 36, and 37, and the layers 31 and 32, in the insulation material 30 becomes facilitated, and formation of a small and thin multilayer board 23 or an increase of the number of the pins can be achieved. Further, since it is unnecessary to install the power supply pins at the bottom by the present embodiment, additional signal pins can be installed to the positions of the conventional power supply pins, and the number of the signal pins 27S that can be installed is increased, without changing the size of the multilayer board 23.

Furthermore, by forming the bottom power supply layer 42 at the bottom surface of the insulation material 30, it becomes possible to reduce the number of the power supply layers in the insulation material 30 by one, and the multilayer board 23 can be made thinner. In this manner, the semiconductor device 20 employing the multilayer board 23 according to the second embodiment of the present invention can be made smaller and thinner, providing a larger number of signal pins, and high stability.

Next, the third embodiment of the present invention is explained.

Figure 11:
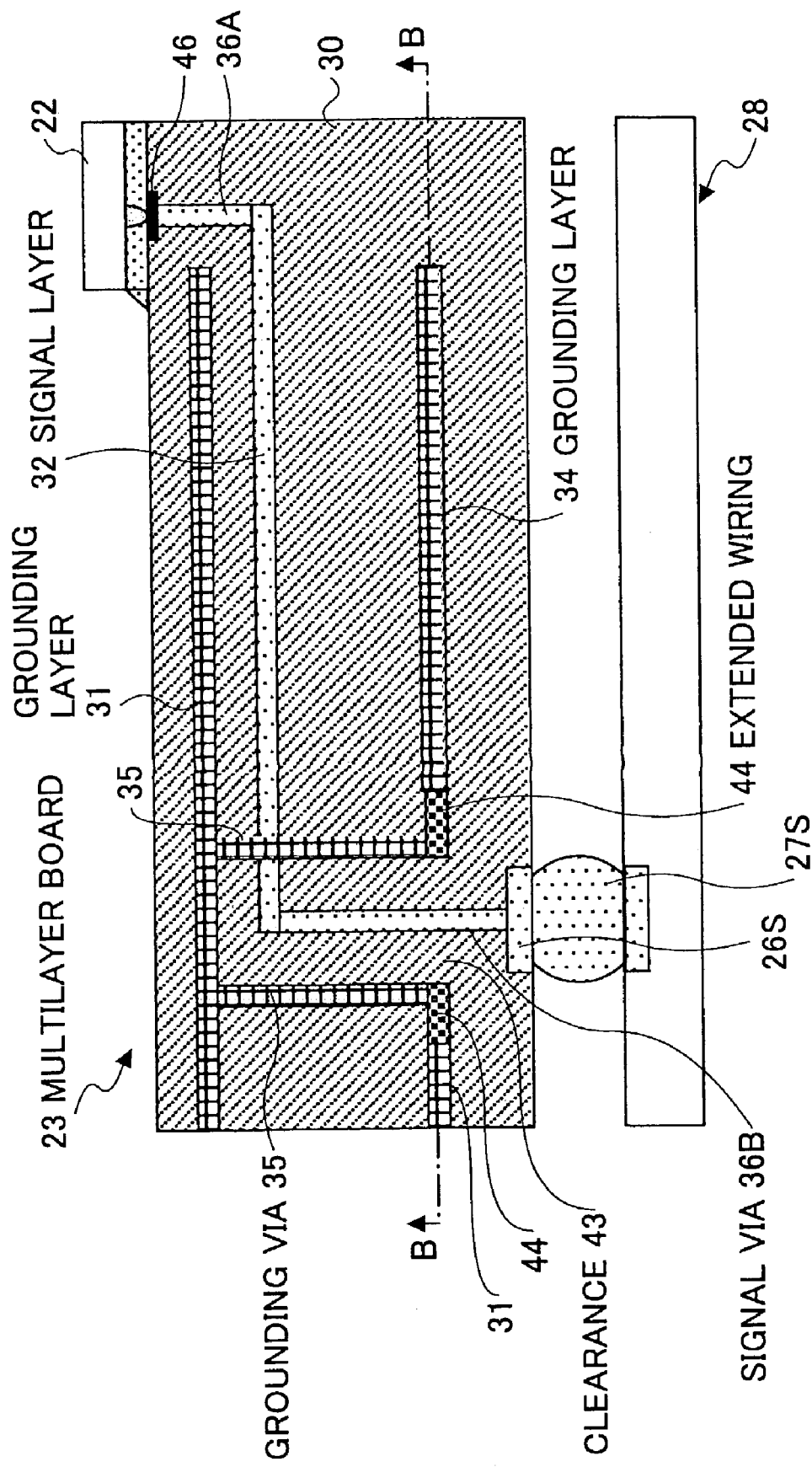
FIG. 11 shows a structure near a signal via of the semiconductor device of the third embodiment of the present invention.
Figure 12:
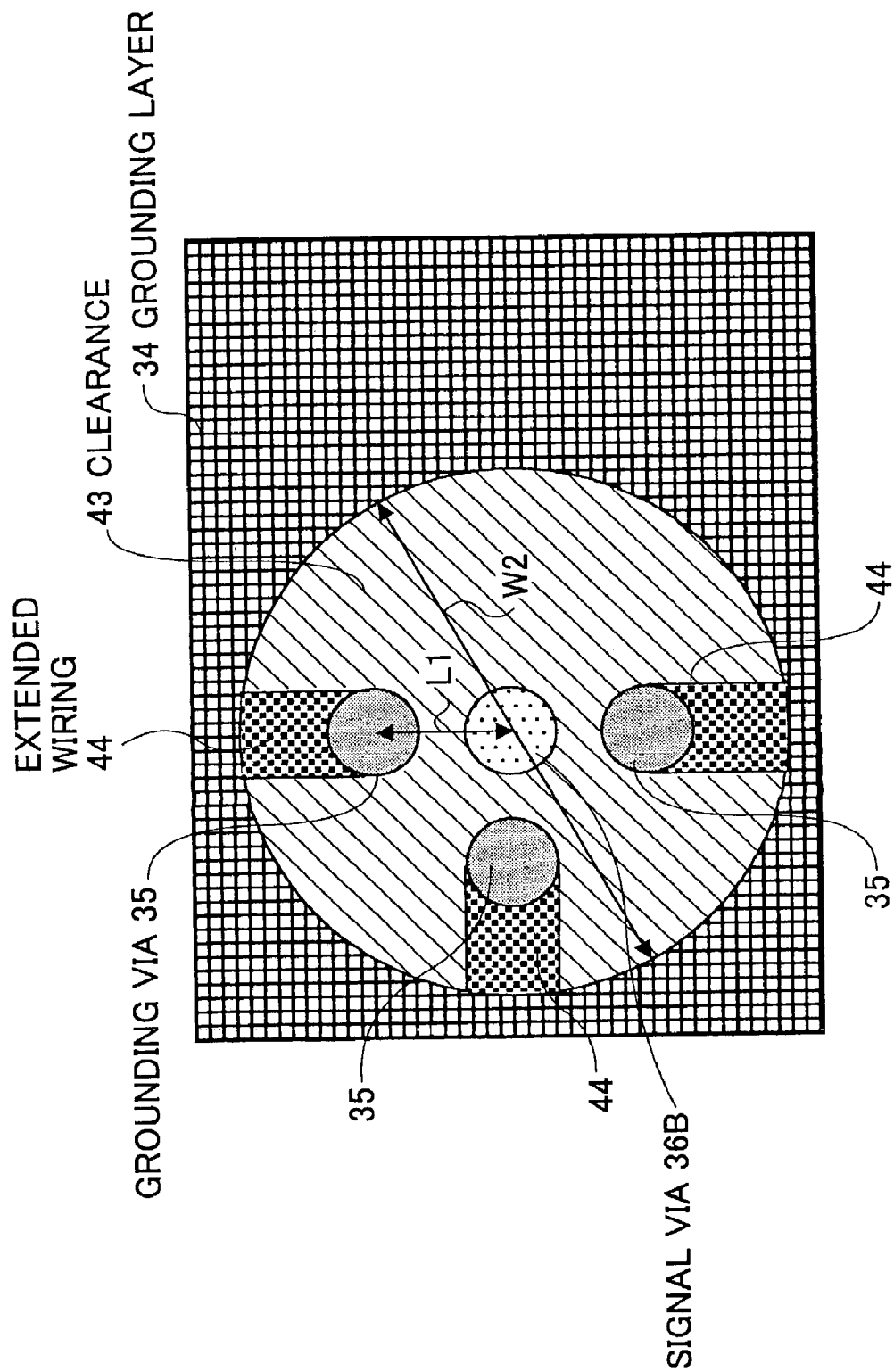
FIG. 12 is a sectional view of FIG. 11 intersected by a plane represented by the line B—B.

FIG. 11 and FIG. 12 show the multilayer board 23 of the third embodiment of the present invention. FIG. 11 is a sectional view of the multilayer board 23, and shows a signal wiring line that connects the semiconductor element 22 and the signal pin 27S. Further, FIG. 12 is a sectional view of FIG. 11 intersected by a plane represented by the line B—B.

The vamp 24 provided to the semiconductor element 22 is connected to the pad 46 formed on the upper surface of the multilayer board 23. The pad 46 is connected to the signal land 26S through a signal via 36A, the signal layer 32, and a signal via 36B. Here, the clearance 43 is formed in the grounding layer 31 such that the signal via 36B and the grounding layer 31 are not short-circuited. The signal via 36B passes through the inside of the clearance 43, and is connected to the signal land 26S.

Around the signal via 36B, two or more grounding vias 35 are installed as shown in FIG. 12. The grounding vias 35 are connected to the grounding layer 31 located in the upper part, and a lower grounding layer 34 located in the lower part. In this manner, impedance control of the signal via 36B can be performed, and degradation of the signal characteristics can be prevented.

Figure 13:
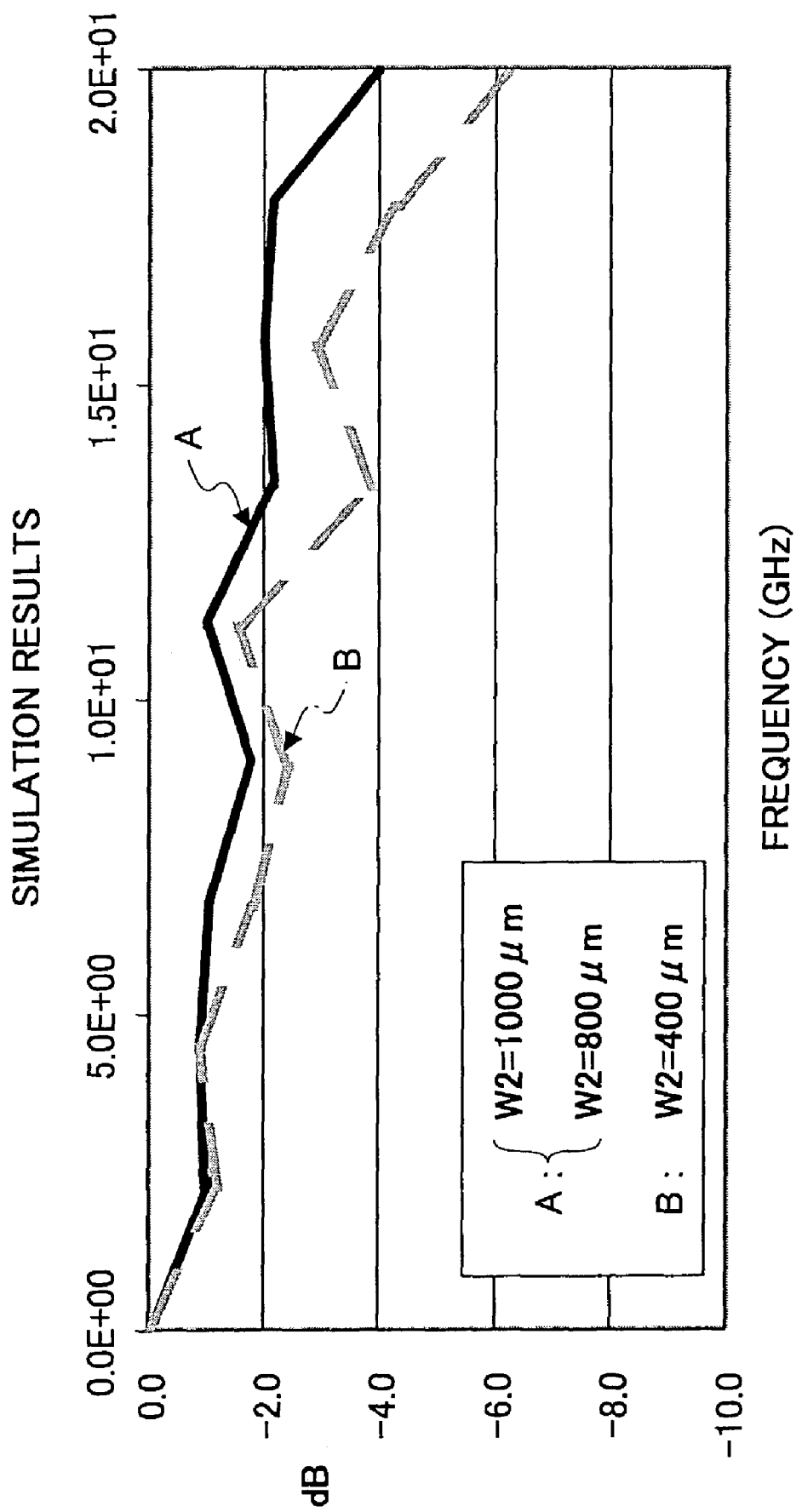
FIG. 13 is a figure showing a result of a simulation that was carried out.
Figure 14:
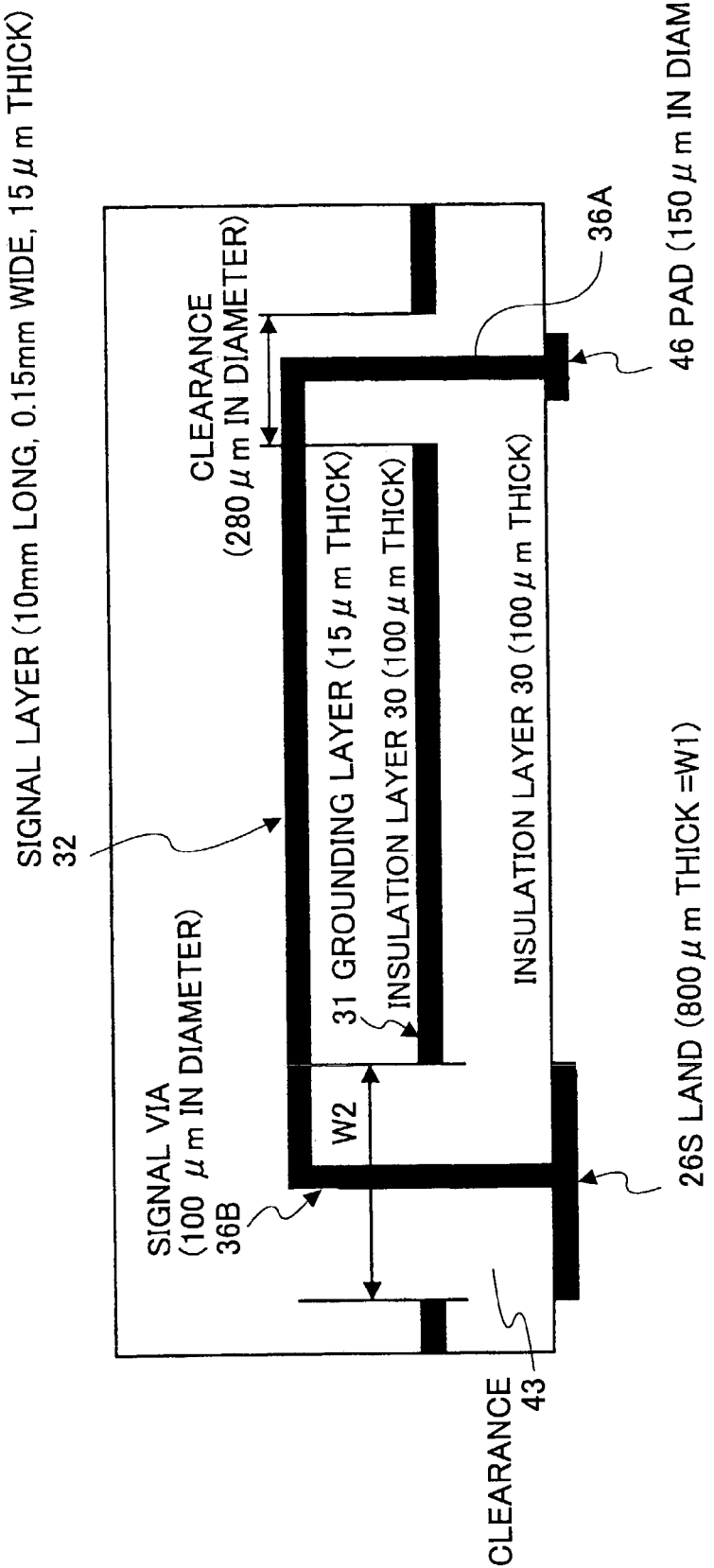
FIG. 14 a figure for explaining conditions of the simulation shown in FIG. 13.

Here, a model of the multilayer board 23 was defined as shown in FIG. 14, and penetration characteristics depending on the diameter W2 of the clearance 43, keeping the diameter W1 of the signal land 26S at a constant, was simulated. The results are given in FIG. 13, which shows the penetration characteristics in the frequency domain. In FIG. 13, the vertical axis represents the penetration amount in dB, and the horizontal axis represents the frequency in GHz. The results show that the penetration amount of a signal falls as the frequency becomes high.

In FIG. 13, the solid line (indicated by an arrow A) shows the characteristics when the diameter W2 of the clearance 43 was set at 800 μm that is equal to the diameter W1 (W1 =800 μm) of the signal land 26S, and when the diameter W2 was set at 1000 μm, which is greater than W1. Results were almost the same for the two diameter values of W2, therefore, only one plot is given, as represented by the arrow A. On the other hand, when the diameter W2 of the clearance 43 was set at 400 μm, which is smaller than the diameter W1 (W1=800 μm) of the signal land 26S, the characteristics became as shown by the dashed line (indicated by an arrow B).

As seen in above, the penetration characteristics of the signal in the signal via 36B are improved where the diameter W2 of the clearance 43 formed in the lower grounding layer 34 near the signal land 26S is set greater than the diameter W1 of the signal land 26S (i.e., W2>=W1). That is, the larger clearance suppresses signal reflection due to impedance mismatching at the external connection terminal portion, and is effective in suppressing degradation of the signal characteristics. Accordingly, the present embodiment is characterized by setting the diameter W2 of the clearance 43 greater than the diameter W1 of the signal land 26S (W2>=W1), based on the above-mentioned simulation results.

Nevertheless, if the diameter W2 of the clearance 43 is set up large, as mentioned above, the distance L1 (shown by an arrow L1 in FIG. 12) between the grounding via 35 connected to the lower grounding layer 34 and the signal via 36B becomes large, as shown in FIG. 12. If the distance between the vias L1 becomes large, although the signal characteristics improve, the multilayer board 23 becomes large, which is contrary to the objective of making the multilayer board 23 as thin and small as possible.

To cope with this problem, the present embodiment is characterized by forming an extended wiring 44 that protrudes into the clearance 43. The extended wiring 44 protrudes from the lower grounding layer 34 on one end, and is connected to the grounding via 35 on the other end.

In this manner, the large diameter W2 of clearance 43 can be set up, while maintaining the distance L1 between the signal via 36B and the grounding via 35 small, that is, maintaining the ability to install the pins densely, and providing the improved signal characteristics. Further, by using the multilayer board 23 of the present embodiment, a semiconductor device that provides desirable signal characteristics can be made small and thin.

Next, the fourth embodiment the present invention is described.

Figure 15:
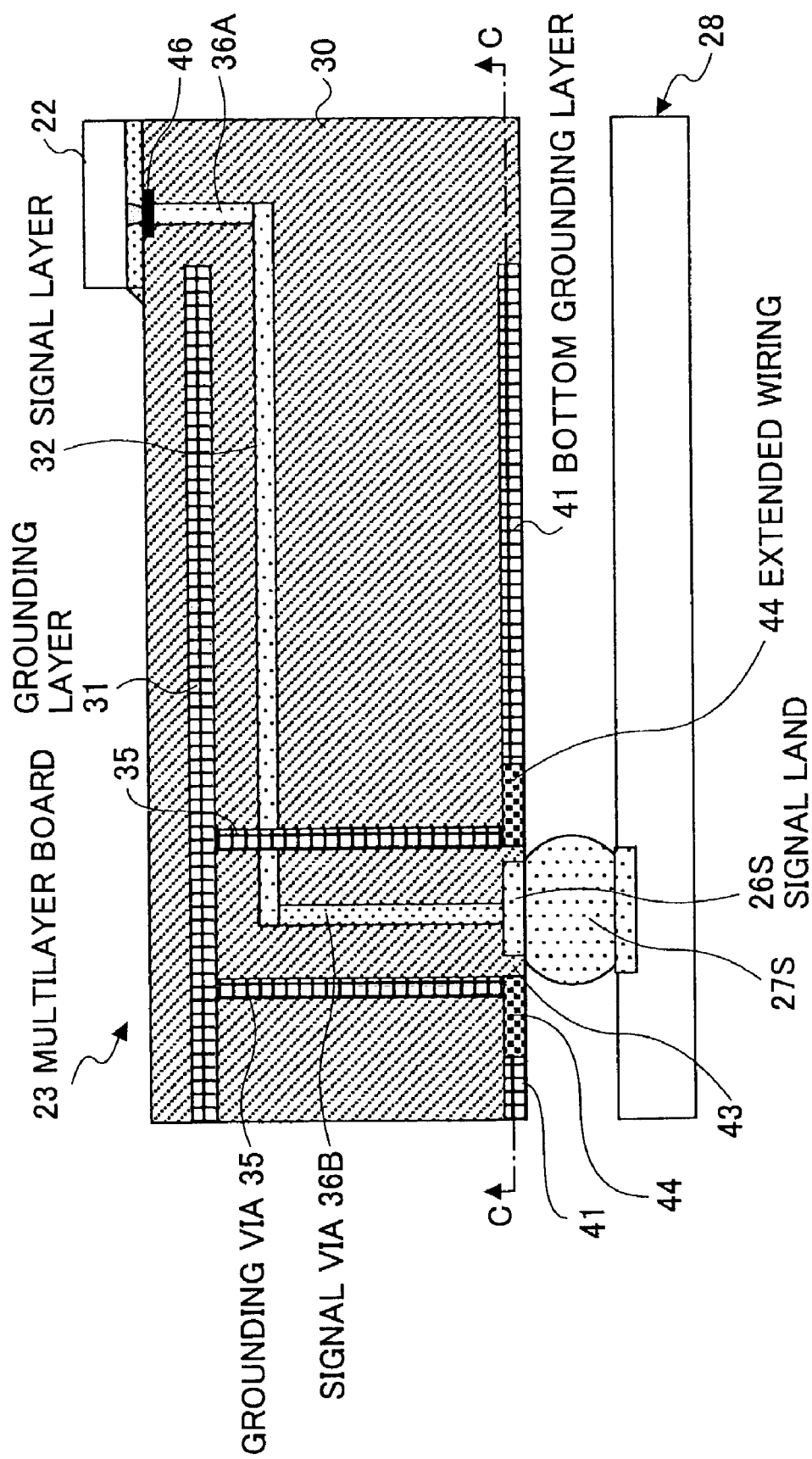
FIG. 15 shows a structure near the signal via of the semiconductor device of the fourth embodiment of the present invention.
Figure 16:
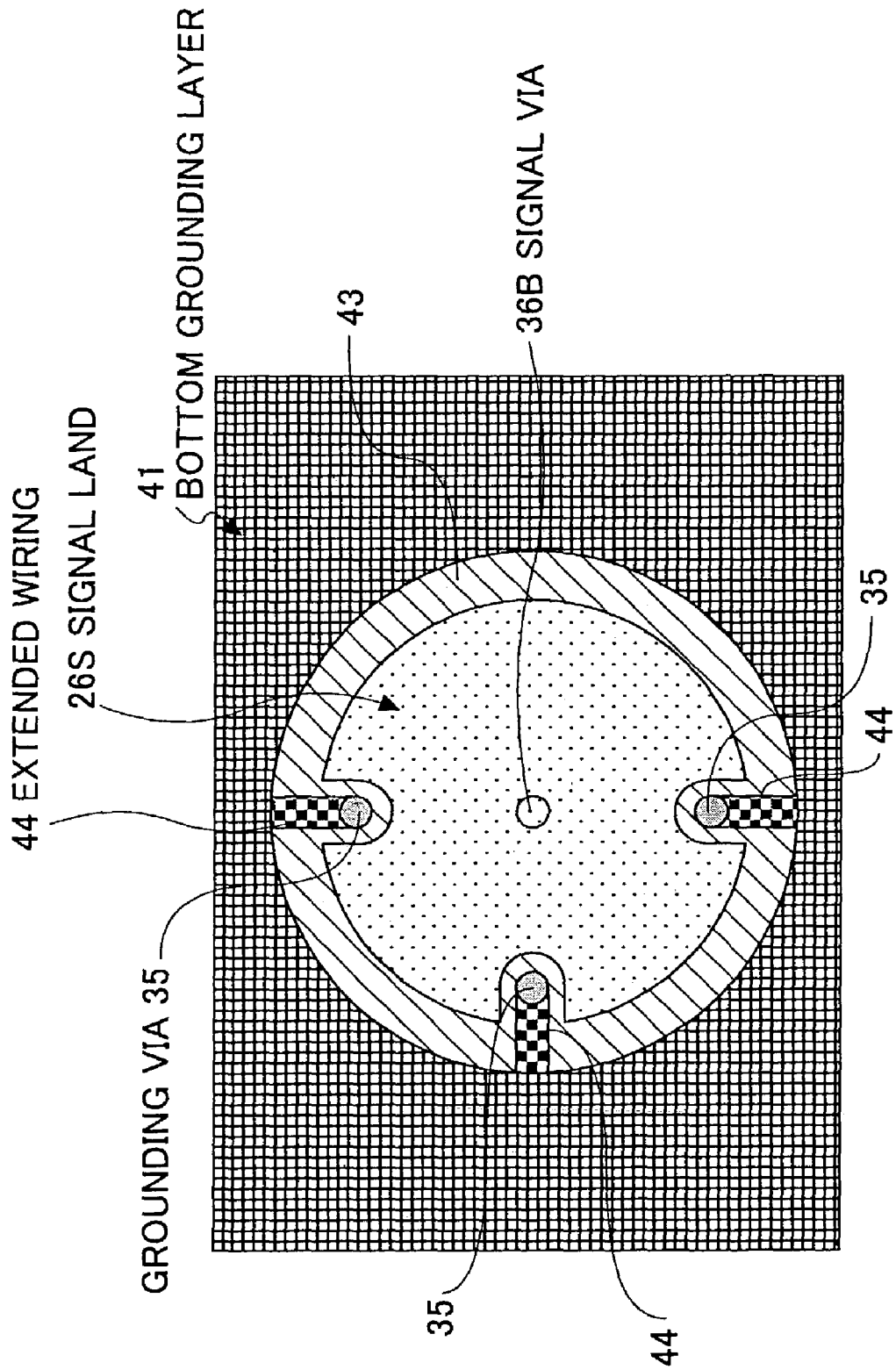
FIG. 16 a sectional view of FIG. 15 intersected by a plane represented by the line C—C.

FIG. 15 and FIG. 16 show the multilayer board 23 of the fourth embodiment of the present invention. FIG. 15 is a sectional view of the multilayer board 23, and shows a signal wiring line that connects the semiconductor element 22 and the signal pin 27S. Further, FIG. 12 is a sectional view intersected by a plane represented by the C—C line of FIG. 11.

Although the fourth embodiment takes a configuration similar to the third embodiment, the fourth embodiment provides the signal land 26S, and the bottom grounding layer 41 (that is the grounding layer closest to the signal land 26S) at the bottom surface of the insulation material 30; in contrast to the third embodiment wherein the lower grounding layer 34 is provided inside the insulation material 30.

In order to form both the signal land 26S and the bottom grounding layer 41 at the bottom surface of the insulation material 30, the clearance 43 is formed between the signal land 26S and the bottom grounding layer 41 such that they are electrically isolated, as is shown in FIG. 16.

Further, the extended wiring 44 is formed toward the signal via 36B in the bottom grounding layer 41 for the same reason as explained in the third embodiment, and the extended wiring 44 is connected to the grounding via 35. In this manner, the multilayer board 23 of the present embodiment realizes both high density of the pins, and degradation prevention of the signal characteristics.

Further, an insulation film is formed in the upper part of the extended wiring 44, such that a short circuit between the signal pin 27S provided to the signal land 26S and the extended wiring 44 is prevented from occurring.

By the above-mentioned configuration, impedance control of the signal via 36B is attained at the bottom, and degradation of signal characteristics can be prevented. Further, the present configuration, wherein the extended wiring 44 and the bottom grounding layer 41 are provided at the bottom surface of the insulation material 30, simplifies the layer structure of the multilayer board 23, compared with the third embodiment, wherein the extended wiring 44 and the lower grounding layer 34 are provided within the insulation material 30.

Next, the fifth embodiment of the present invention is described.

Figure 17:
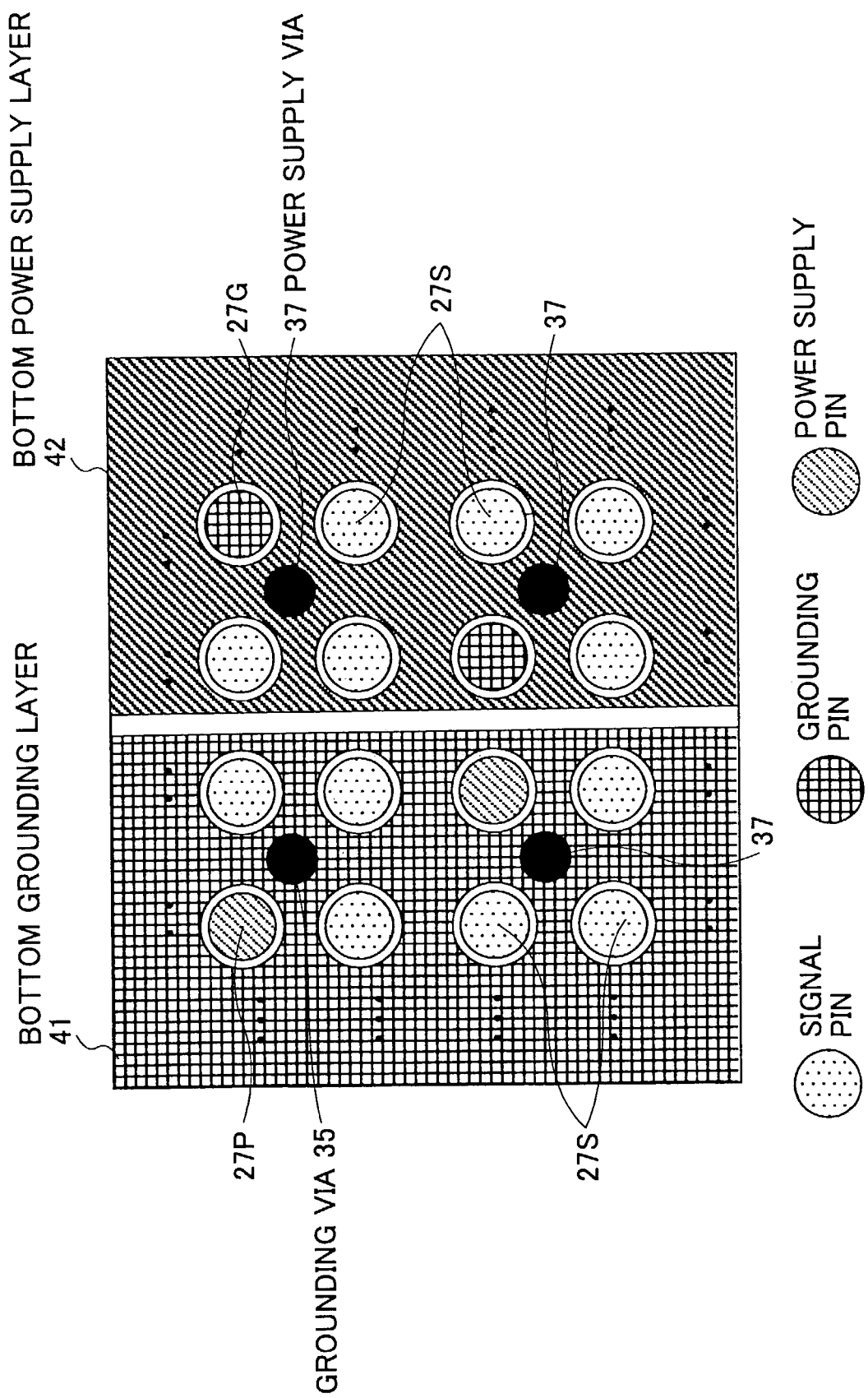
FIG. 17 is a bottom plan view of the semiconductor device of the fifth embodiment of the present invention.

FIG. 17 is a bottom plan view of the multilayer board 23 of the fifth embodiment of the present invention. In the preceding embodiments, one of the bottom grounding layer 41 and the bottom power supply layer 42 is provided covering almost all of the bottom surface of the insulation material 30. However, it is possible to provide both the bottom grounding layer 41 and the bottom power supply layer 42 at the bottom surface of the insulation material 30, sharing the space. In the fifth embodiment, both the bottom grounding layer 41 and the bottom power supply layer 42 are provided at the bottom surface of the insulation material 30, as shown in FIG. 17.

Further, even if only one of the bottom grounding layer 41 and the bottom power supply layer 42 is to be installed at the bottom surface of the insulation material 30, it is not necessary that the layer 41 or 42 occupies the entire bottom surface. Only a part of the bottom surface may be covered by the layer. However, in this case, in order to increase the number of signal pins 27S and to realize high density of the multilayer board 23, it is desirable that the layer 41 or 42 occupies 50% or more of the bottom surface of the insulation material 30.

Next, the sixth case of the present invention is explained.

Figure 18:
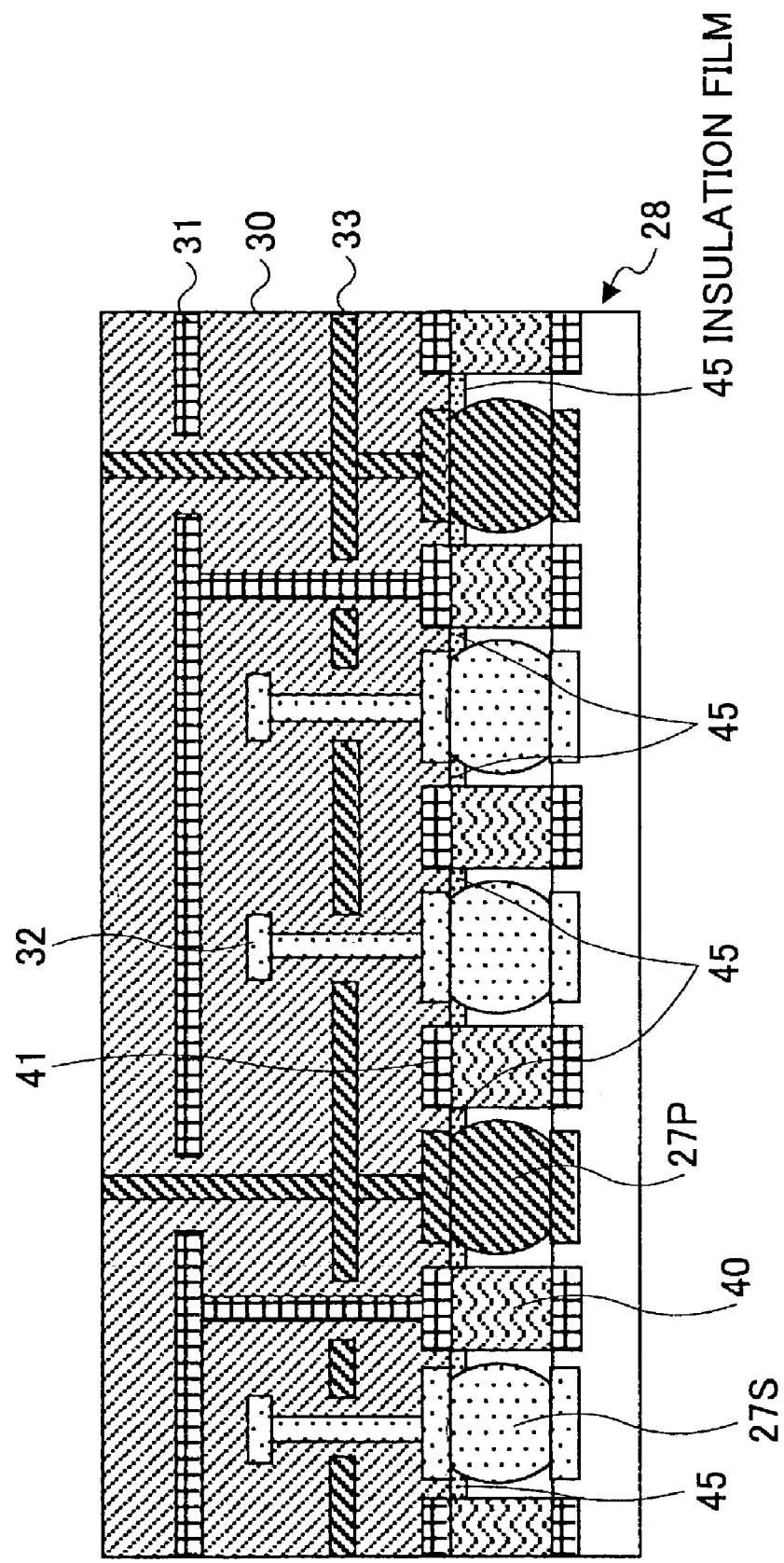
FIG. 18 is a sectional view of the semiconductor device of the sixth embodiment of the present invention.

FIG. 18 is a sectional view of the multilayer board of the sixth embodiment of the present invention. In the embodiments described above, the bottom grounding layer 41 and the bottom power supply layer 42 are exposed at the bottom surface of the insulation material 30.

To the contrary, in the sixth embodiment, an insulation film 45 is provided such that the bottom grounding layer 41 is covered (except for the formation positions of the signal land 26S and the power supply land 26P) if the bottom grounding layer 41 is installed as the bottom layer; and an insulation film 45 is provided such that the bottom power supply layer 42 is covered (except for the formation positions of the signal land 26S and the grounding land 26G) if the bottom power supply layer 42 is installed as the bottom layer.

Purposes of providing the insulation film 45 and the like, that is, overcoat processing, to the layers 41 and 42 of the present embodiment are to protect the bottom grounding layer 41, the bottom power supply layer 42, and the multilayer board 23, and to meet the requirements of the semiconductor device 20, etc. The present invention patently includes the configuration wherein the underneath (exposed from and flush with the bottom surface of insulation material 20) of the layers 41 and 42 is over-coated, the layers 41 and 42 being formed at the bottom surface of the insulation material 30.

As described above, according to the present invention, various effects are realized as summarized below.

The number of signal pins can be increased without changing the size of the multilayer board, while electrical properties and mounting reliability are improved, and the multilayer board can be made thin because the number of grounding layers or power supply layers can be decreased by one.

Since the flexibility in deciding installation positions of the grounding vias or the power supply vias, as the case may be, is raised, layout of the vias and the layers (signal layer, etc.) in the insulation material becomes easy, realizing a higher-density multilayer board.

Electrical connection properties between the bottom grounding layer or the bottom power supply layer, and the external electrodes are strengthened. Further, the conductive film is provided at arbitrary positions of the bottom grounding layer or the bottom power supply layer, providing great flexibility in the selection of the land installation positions.

Further, since the grounding or the power supply is enhanced as the number of signal pins of the multilayer board increases, a highly dense semiconductor device with high stability can be realized.

Further, the impedance mismatching of the signal via can be controlled, and the degradation of the signal characteristics can be suppressed.

Further, since the impedance control of the signal via is attained at the bottom, both simplification of the layer structure and prevention of the signal characteristic degradation are attained.

Further, the present invention is not limited to these embodiments, but various variations and modifications may be made without departing from the scope of the present invention.

The present application is based on Japanese priority application No. 2002-250936 filed on Aug. 29, 2002 with the Japanese Patent Office, the entire contents of which are hereby incorporated by reference.

What is claimed is:

1. A multilayer board, comprising:
    an insulation material,
    a grounding layer formed in the insulation material, and inter-layer-connected by a grounding via,
    a power supply layer formed in the insulation material, and interlayer-connected by a power supply via,
    a signal layer formed in the insulation material, and inter-layer-connected by a signal via,
    a power supply land formed at the bottom surface of the insulation material, and connected to the power supply layer and to an external point,
    a signal land formed at the bottom surface of the insulation material, and connected to the signal layer and to an external point,
    a bottom grounding layer having a plurality of clearances which the power supply land and the signal land are individually formed within, and
    wherein the bottom grounding layer is provided with a conductive film connection terminal formed by a conductive film, and
    wherein the power supply land and the signal land are respectively each provided with solder ball connection terminals formed by solder balls.

2. The multilayer board as claimed in claim 1, wherein the grounding layer and the bottom grounding layer are connected by the grounding via.

3. The multilayer board as claimed in claim 1, wherein the formation area of the bottom grounding layer is equal to or greater than 50% of the bottom surface of the insulation material.

4. A semiconductor device, comprising:
    a semiconductor element,
    a board that is installed with the semiconductor element on one side, and a connection terminal to an external point on the other side, the board being the multilayer board as claimed in claim 1.

5. A multilayer board, comprising:
    an insulation material,
    a grounding layer formed in the insulation material, and inter-layer-connected by a grounding via,
    a power supply layer formed in the insulation material, and inter-layer-connected by a power supply via,
    a signal layer formed in the insulation material, and inter-layer-connected by a signal via,
    a grounding land formed at the bottom surface of the insulation material, and connected to the grounding layer and to an external point,
    a signal land formed at the bottom surface of the insulation material, and connected to the signal layer and to an external point,
    a bottom power supply layer having a plurality of clearances which the grounding land and the signal land are individually formed within, and
    wherein the bottom power supply layer is provided with a conductive film connection terminal formed by a conductive film, and
    wherein the grounding land and the signal land are respectively each provided with solder ball connection terminals formed by solder balls.

6. The multilayer board as claimed in claim 5, wherein the power supply layer and the bottom power supply layer are connected by the power supply via.

7. The multilayer board as claimed in claim 5, wherein a formation area of the bottom power supply layer is equal to or greater than 50% of the bottom surface of the insulation material.

8. A semiconductor device, comprising:
    a semiconductor element,
        a board that is installed with the semiconductor element on one side, and a connection terminal to an external point on the other side, the board being the multilayer board as claimed in claim 5.

* * * * *